(12) United States Patent
Choi et al.

(10) Patent No.: US 12,552,971 B2
(45) Date of Patent: Feb. 17, 2026

(54) ELECTRICALLY CONDUCTIVE BONDING TAPE WITH LOW PASSIVE INTERMODULATION

(71) Applicant: 3M INNOVATIVE PROPERTIES COMPANY, St. Paul, MN (US)

(72) Inventors: Jeongwan Choi, Suwon-Si (KR); Jeffrey W. McCutcheon, Baldwin, WI (US); Marina M. Kaplun, Woodbury, MN (US); Steven Y. Yu, St. Paul, MN (US); Jinbae Kim, Ansan (KR)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 465 days.

(21) Appl. No.: 18/125,818

(22) Filed: Mar. 24, 2023

(65) Prior Publication Data

US 2023/0235200 A1 Jul. 27, 2023

Related U.S. Application Data

(63) Continuation of application No. 17/992,224, filed on Nov. 22, 2022, now Pat. No. 12,129,411, which is a
(Continued)

(51) Int. Cl.
 *C09J 7/38* (2018.01)
 *C09J 7/25* (2018.01)
 (Continued)

(52) U.S. Cl.
 CPC ............. *C09J 7/385* (2018.01); *C09J 7/255* (2018.01); *C09J 7/28* (2018.01); *H01R 4/04* (2013.01); *H05K 9/0088* (2013.01); *H01B 1/22* (2013.01)

(58) Field of Classification Search
 CPC ... C09J 7/385; C09J 7/255; C09J 7/28; H01R 4/04; H05K 9/0088; H01B 1/22
 See application file for complete search history.

(56) References Cited

U.S. PATENT DOCUMENTS

| 9,238,760 | B2 | 1/2016 | Harkins |
| 2019/0143636 | A1 | 5/2019 | Seo et al. |

(Continued)

FOREIGN PATENT DOCUMENTS

| WO | 2012071484 A2 | 5/2012 |
| WO | 2015112532 A1 | 7/2015 |

OTHER PUBLICATIONS

Translation of JP-6748203-B2, Ishikawa et al, Aug. 26, 2020 (Year: 2020).*

(Continued)

*Primary Examiner* — Nathan L Van Sell
(74) *Attorney, Agent, or Firm* — Jonathan L. Tolstedt

(57) ABSTRACT

An electrically conductive bonding tape includes a conductive self-supporting first layer conductive in each of three mutually orthogonal directions and including conductive opposing first and second major surfaces, an conductive second layer coated on the first major surface of the self-supporting first layer and having at least 60% by weight of nickel, the second layer having an exposed major surface facing away from the first major surface of the self-supporting first layer and exposing at least some of the nickel in the second layer, and a conductive adhesive third layer bonded to the second major surface of the self-supporting first layer opposite the second layer. The adhesive third layer is conductive in at least one of the three mutually orthogonal directions and includes a plurality of conductive elements
(Continued)

dispersed in an insulative material, at least some of the conductive elements physically contacting the self-supporting first layer.

5 Claims, 4 Drawing Sheets

Related U.S. Application Data continuation of application No. PCT/IB2022/057164, filed on Aug. 2, 2022.

(60) Provisional application No. 63/229,731, filed on Aug. 5, 2021.

(51) Int. Cl.
*C09J 7/28* (2018.01)
*H01B 1/22* (2006.01)
*H01R 4/04* (2006.01)
*H05K 9/00* (2006.01)

(56) References Cited

U.S. PATENT DOCUMENTS

2019/0185721 A1 6/2019 Seo et al.
2021/0040356 A1 2/2021 Lin et al.

OTHER PUBLICATIONS

Translation of WO-2017216947-A1, Ishikawa et al, Dec. 21, 2017 (Year: 2017).*
Partial International Search for PCT International Application No. PCT/IB2022/057164, mailed on Nov. 17, 2022, 14 pages.

* cited by examiner

ELECTRICALLY CONDUCTIVE BONDING TAPE WITH LOW PASSIVE INTERMODULATION

CROSS REFERENCE TO RELATED APPLICATION

This application is a continuation filing of U.S. application Ser. No. 17/992,224, filed Nov. 22, 2022, which is a continuation filing of PCT Application No. PCT/IB2022/057164, filed Aug. 2, 2022, which claims the benefit of U.S. Provisional Application No. 63/229,731, filed Aug. 5, 2021, the disclosures of which are incorporated by reference in their entireties herein.

SUMMARY

In some aspects of the present description, an electrically conductive bonding tape is provided, the electrically conductive bonding tape including an electrically conductive self-supporting first layer, an electrically conductive second layer coated on a first major surface of the self-supporting first layer, and an electrically conductive adhesive third layer bonded to a second major surface of the self-supporting first layer opposite the second layer. The electrically conductive self-supporting first layer is electrically conductive in each of three mutually orthogonal directions and has electrically conductive opposing first and second major surfaces. The electrically conductive self-supporting first layer has an average thickness of greater than about 4 microns. The electrically conductive second layer includes at least 60% by weight of nickel, and the layer has an average thickness of greater than about 0.03 microns. The electrically conductive second layer has an exposed major surface facing away from the first major surface of the self-supporting first layer which exposes at least some of the nickel in the second layer. The adhesive third layer is electrically conductive in at least one of the three mutually orthogonal directions and includes a plurality of electrically conductive elements dispersed in a substantially electrically insulative material. At least some of the electrically conductive elements physically contact the second major surface of the self-supporting first layer.

In some aspects of the present description, an electrically conductive bonding tape is provided, the electrically conductive bonding tape electrically conductive in at least a thickness direction of the bonding tape and including an electrically conductive self-supporting nickel first layer having at least 80% by weight of nickel and an electrically conductive adhesive second layer. The electrically conductive self-supporting nickel first layer is electrically conductive in each of three mutually orthogonal directions and includes conductive opposing first and second major surfaces and has an average thickness of greater than about 4 microns. The electrically conductive adhesive second layer is bonded to the second major surface of the self-supporting first layer. The adhesive second layer is electrically conductive in at least one of the three mutually orthogonal directions and includes a plurality of electrically conductive elements dispersed in a substantially electrically insulative material. At least some of the electrically conductive elements physically contact the second major surface of the self-supporting first layer.

DETAILED DESCRIPTION

Figure 1A:
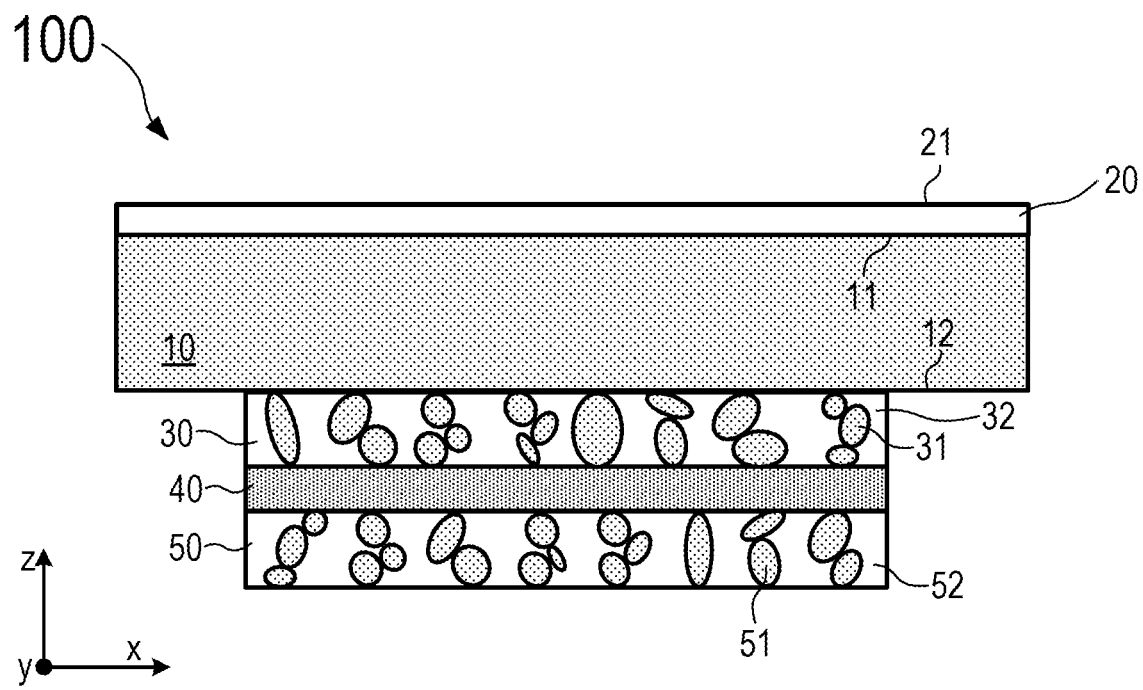
FIG. 1A is a side view of an electrically conductive bonding tape, in accordance with an embodiment of the present description.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Passive intermodulation (PIM) is the generation of interfering signals in an electric system which can result from nonlinearities in the mechanical components of a system. This occurs when certain structural elements within the system (e.g., interconnections between components, corroded components, etc.) act like diodes, producing undesired interference signals, including the generation of harmonics or intermodulation. Sometimes, tapes and/or foils may be added to a system to provide grounding or EMI shielding for the components within the system, and these added layers can sometimes add interfaces between components which can contribute to the amount of PIM generated, degrading the performance of the system.

Low PIM surface interfaces on foil and fabric tapes are important for radio frequency (RF) electromagnetic noise reduction and improved signal-to-noise ratio (SNR) performance in modern day RF devices such as from cell phones. A common but expensive solution to provide a low PIM interface for grounding in RF or similar devices is to add a gold coating at the grounding or connection interface. However, gold is very expensive and adds significant cost to the system. Therefore, tapes with an improved backing (i.e., reduce PIM interference but without the excessive cost) are desired.

According to some aspects of the present description, new foil/fabric tape solutions are provided that can be applied to a high PIM surface and improve the resultant PIM performance versus a similar tape with a gold backing or a solution that uses an even more expensive sputtered gold interface on an end device surface. In some aspects of the present description, an electrically conductive bonding tape includes an electrically conductive self-supporting first layer, an electrically conductive second layer coated on a first major surface of the self-supporting first layer, and an electrically conductive adhesive third layer bonded to a second major surface of the self-supporting first layer opposite the second layer.

In some embodiments, the electrically conductive self-supporting first layer may be electrically conductive in each of three mutually orthogonal directions (e.g., an x-axis, y-axis, and z-axis of the layer) and has electrically conductive opposing first and second major surfaces. In some embodiments, the first layer may be substantially equally electrically conductive in each of the three mutually orthogonal directions. In some embodiments, the electrically conductive self-supporting first layer may have an average thickness of greater than about 4 microns, or about 6 microns, or about 8 microns, or about 10 microns, or about 20 microns, or about 50 microns, or about 75 microns, or about 100 microns, or about 125 microns, or about 150 microns, or about 175 microns, or about 200 microns. In some embodiments, the first layer may be a copper foil layer.

In some embodiments, the electrically conductive second layer may include at least 60%, or at least 70%, or at least 80%, or at least 90%, or at least 95%, or at least 98%, or at least 99%, or at least 99.5% by weight of nickel, and the layer may have an average thickness of greater than about 0.03 microns, or about 0.04 microns, or about 0.05 microns, or about 0.1 microns, or about 0.25 microns, or about 0.5 microns, or about 1 micron, or about 2 microns, or about 3 microns, or about 4 microns, or about 5 microns. In some embodiments, the second layer may include nickel or a nickel alloy.

In some embodiments, when the second layer includes a nickel alloy, the nickel alloy may include one or more of a nickel vanadium alloy (NiV), a nickel chromium alloy (NiCr), a nickel tin alloy (SnNi), a nickel phosphorous alloy (NiP), a nickel titanium alloy (NiTi) and a nickel niobium alloy (NiNb). In embodiments including a nickel vanadium alloy (NiV), a weight percentage of the nickel may be in a range from about 90% to about 96%, and a weight percentage of the vanadium may be in a range from about 4% to 10%. In embodiments including a nickel chromium alloy (NiCr), a weight percentage of the nickel may be in a range from about 70% to about 90%, and a weight percentage of the chromium may be in a range from about 10% to 30%. In embodiments including a nickel tin alloy (SnNi), a weight percentage of the nickel may be in a range from about 25% to about 45%, and a weight percentage of the tin may be in a range from about 55% to 75%. In embodiments including a nickel phosphorous alloy (NiP), a weight percentage of the nickel may be in a range from about 80% to about 95%, and a weight percentage of the phosphorous may be in a range from about 5% to 20%. In embodiments including a nickel titanium alloy (NiTi), a weight percentage of the nickel may be in a range from about 50% to about 70%, and a weight percentage of the titanium may be in a range from about 30% to 50%.

In some embodiments, the electrically conductive second layer may have an exposed major surface facing away from the first major surface of the self-supporting first layer which exposes at least some of the nickel in the second layer. In some embodiments, the adhesive third layer may be electrically conductive in at least one of the three mutually orthogonal directions (e.g., the z-axis, or the thickness direction of the layer) and may include a plurality of electrically conductive elements dispersed in a substantially electrically insulative material. In some embodiments, at least some of the electrically conductive elements may physically contact the second major surface of the self-supporting first layer. In some embodiments, the conductive elements in the adhesive third layer may include one or more of conductive particles and conductive fibers. In some embodiments, the conductive particles may include insulative particles coated with one or more conductive coatings. In some embodiments, the conductive fibers may include insulative fibers (34a) coated with one or more conductive coatings (34b, 34c).

In some embodiments, the electrically conductive bonding tape of claim 1 may further include an electrically conductive fourth layer sandwiched between, and bonded to, the electrically conductive adhesive third layer and an electrically conductive adhesive fifth layer. In some embodiments, the adhesive fifth layer may be electrically conductive in at least one of the three mutually orthogonal directions (e.g., the z-axis, or the thickness direction of the layer). In some embodiments, the fifth layer may include a plurality of electrically conductive elements dispersed in a substantially electrically insulative material. In some embodiments, at least some of the electrically conductive elements of the fifth layer may physically contact the fourth layer.

According to some aspects of the present description, an electronic system may include a substrate including one or more of stainless steel, aluminum, and titanium (or other conductive metal substrate or coating, including indium tin oxide), the bonding tape previously described including the electrically conductive fourth layer and electrically conductive adhesive fifth layer, and an electrically conductive resilient component (e.g., an electrically conductive spring clip) resiliently pressed against, and making physical contact with, the exposed major surface of the second layer. In some embodiments, the electrically conductive resilient component may include a gold coating or gold-coated connection point, the gold coating or connection point making physical contact with the exposed major surface of the second layer.

According to some aspects of the present description, an electrically conductive bonding tape may be electrically conductive in at least a thickness direction of the bonding tape and may include an electrically conductive self-supporting nickel first layer having at least 80%, or at least 85%, or at least 90%, or at least 95%, or at least 98%, or at least 99%, or at least 99.5% by weight of nickel and an electrically conductive adhesive second layer.

In some embodiments, the electrically conductive self-supporting nickel first layer may be electrically conductive in each of three mutually orthogonal directions and may include conductive opposing first and second major surfaces. In some embodiments, the nickel first layer may have an average thickness of greater than about 4 microns, or about 6 microns, or about 8 microns, or about 10 microns, or about 20 microns, or about 50 microns, or about 75 microns, or about 100 microns, or about 125 microns, or about 150 microns, or about 175 microns, or about 200 microns.

In some embodiments, the electrically conductive adhesive second layer may be bonded to the second major surface of the self-supporting first layer. In some embodiments, the adhesive second layer is electrically conductive in at least one of the three mutually orthogonal directions and includes a plurality of electrically conductive elements dispersed in a substantially electrically insulative material. In some embodiments, at least some of the electrically conductive elements may physically contact the second major surface of the self-supporting first layer.

In some embodiments, the electrically conductive bonding tape may further include an electrically conductive third layer sandwiched between, and bonded to, the electrically conductive adhesive second layer and an electrically conductive adhesive fourth layer. In some embodiments, the adhesive fourth layer may be electrically conductive in at least one of the three mutually orthogonal directions. In some embodiments, the adhesive fourth layer may include a plurality of electrically conductive elements dispersed in a substantially electrically insulative material. In some embodiments, at least some of the electrically conductive elements of the fourth layer may physically contact the third layer.

In some embodiments, the electrically conductive bonding tape may further include an electrically conductive fifth layer coated on the first, opposite the second, major surface of the first layer. In some embodiments, the fifth layer may include at least 20%, or at least 30%, or at least 40%, or at least 50%, or at least 60%, or at least 70%, or at least 80% by weight of nickel. In some embodiments, the fifth layer may have an average thickness of greater than about 0.03 microns, or about 0.04 microns, or about 0.05 microns, or about 0.1 microns, or about 0.25 microns, or about 0.5 microns, or about 1 micron, or about 2 microns, or about 3 microns, or about 4 microns, or about 5 microns.

In some embodiments, the electrically conductive fifth layer may include a nickel alloy including one or more of a nickel vanadium alloy (NiV), a nickel chromium alloy (NiCr), a nickel tin alloy (SnNi), a nickel phosphorous alloy (NiP), a nickel titanium alloy (NiTi) and a nickel niobium alloy (NiNb). In embodiments including a nickel vanadium alloy (NiV), a weight percentage of the nickel may be in a range from about 90% to about 96%, and a weight percentage of the vanadium may be in a range from about 4% to 10%. In embodiments including a nickel chromium alloy (NiCr), a weight percentage of the nickel may be in a range from about 70% to about 90%, and a weight percentage of the chromium may be in a range from about 10% to 30%. In embodiments including a nickel tin alloy (SnNi), a weight percentage of the nickel may be in a range from about 25% to about 45%, and a weight percentage of the tin may be in a range from about 55% to 75%. In embodiments including a nickel phosphorous alloy (NiP), a weight percentage of the nickel may be in a range from about 80% to about 95%, and a weight percentage of the phosphorous may be in a range from about 5% to 20%. In embodiments including a nickel titanium alloy (NiTi), a weight percentage of the nickel may be in a range from about 50% to about 70%, and a weight percentage of the titanium may be in a range from about 30% to 50%.

In some embodiments, the adhesive second layer may be more conductive in a thickness direction thereof than any orthogonal in-plane direction. In other embodiments, the adhesive second layer may be more conductive in an in-plane direction thereof than in a thickness direction. That is, the conductive elements in the adhesive second layer may be configured such that the adhesive second layer is more conductive in the thickness direction of the layer (e.g., the z-axis of the layer) or in the in-plane direction of the layer (e.g., the plane defined by the x-axis and y-axis of the layer).

In some embodiments, the conductive elements in the adhesive second layer may include one or more of conductive particles and conductive fibers. In some embodiments, the conductive particles may include insulative particles coated with one or more conductive coatings. In some embodiments, the conductive fibers may include insulative fibers coated with one or more conductive coatings.

Turning now to the figures, FIG. 1A is a side view of an embodiment of an electrically conductive bonding tape, according to the present description. In some embodiments, an electrically conductive bonding tape 100 may include an electrically conductive first layer 10. In some embodiments, electrically conductive first layer 10 may be a copper foil. In other embodiments, electrically conductive first layer 10 may be a nickel first layer, comprising at least 80% by weight of nickel. Electrically conductive first layer 10 has an electrically conductive first major surface 11 and an opposing electrically conductive second major surface 12.

In some embodiments, an electrically conductive second layer 20 may be coated on the first major surface 11 of the self-supporting first layer 10. In some embodiments, second layer 20 may include at least 60%, or at least 70%, or at least 80%, or at least 90%, or at least 95%, or at least 98%, or at least 99%, or at least 99.5% by weight of nickel. In some embodiments, the second layer may have an average thickness of greater than about 0.03 microns, or about 0.04 microns, or about 0.05 microns, or about 0.1 microns, or about 0.25 microns, or about 0.5 microns, or about 1 micron, or about 2 microns, or about 3 microns, or about 4 microns, or about 5 microns, and an exposed major surface 21 facing away from the first major surface 11 of the self-supporting first layer 10 and exposing at least some of the nickel in the second layer 20.

Figure 1B:
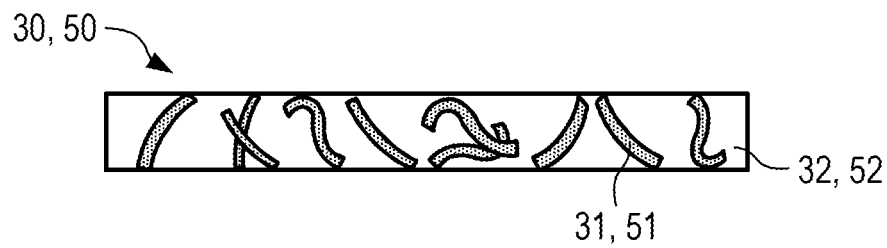
FIG. 1B is a side view of an embodiment of electrically conductive elements in an electrically conductive bonding tape, in accordance with an embodiment of the present description.

In some embodiments, the electrically conductive bonding tape 100 may further include an electrically conductive adhesive third layer 30 bonded to the second major surface 12 of the first layer 10, opposite the second layer 20. In some embodiments, the electrically conductive third layer 30 may include a plurality of electrically conductive elements 31 dispersed in a substantially electrically insulative material 32. In some embodiments, at least some of the electrically conductive elements 31 may physically contact the second major surface 12 of the self-supporting first layer 10. In some embodiments, at least some of the electrically conductive elements 31 may be arranged such that the third layer 30 is electrically conductive at least in the z-axis (i.e., the z-axis as indicated in FIG. 1A, or the thickness direction of the third layer 30). In some embodiments, such as the embodiment shown in FIG. 1A, the electrically conductive elements 31 may include electrically conductive particles. In other embodiments, such as the embodiment shown in FIG. 1B, the electrically conductive elements 31 may include electrically conductive fibers. In some embodiments, the electrically conductive elements 31 may include both electrically conductive particles and electrically conductive fibers (see also FIGS. 3A and 3B).

Figure 1C:
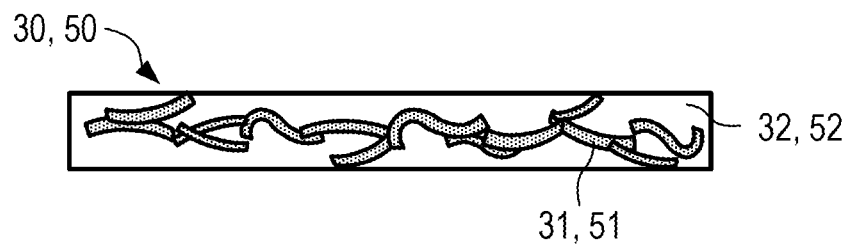
FIG. 1C is a side view of an embodiment of electrically conductive elements in an electrically conductive bonding tape arranged in an alternate orientation, in accordance with an embodiment of the present description.

In some embodiments, such as the embodiment of FIG. 1C, at least some of the electrically conductive elements 31 may be arranged such that the third layer 30 is electrically conductive in at least the in-plane direction (i.e., the plane defined by the x-axis and y-axis as indicated in FIG. 1A), while the through-thickness conductivity (i.e., the conductivity in the z-axis, or thickness direction, of the layer) may be reduced as compared to the conductivity in the in-plane direction.

In some embodiments, the electrically conductive bonding tape 100 may further include an electrically conductive fourth layer 40 sandwiched between, and bonded to, the electrically conductive adhesive third layer 30 and an electrically conductive adhesive fifth layer (50). In some embodiments, the adhesive fifth layer 50 may be electrically conductive in at least one (e.g., the z-axis) of the three mutually orthogonal directions, and may include a plurality of electrically conductive elements 51 dispersed in a substantially electrically insulative material 52. In some embodiments, at least some of the electrically conductive elements 51 of the fifth layer 50 may physically contact the fourth layer 40. In some embodiments, such as the embodiment shown in FIG. 1A, the electrically conductive elements 51 may include electrically conductive particles. In other embodiments, such as the embodiment shown in FIG. 1B, the electrically conductive elements 51 may include electrically conductive fibers. In some embodiments, the electrically conductive elements 51 may include both electrically conductive particles and electrically conductive fibers (see also FIGS. 3A and 3B).

In some embodiments, such as the embodiment of FIG. 1C, at least some of the electrically conductive elements 51 may be arranged such that the fifth layer 50 is electrically conductive in at least the in-plane direction (i.e., the plane defined by the x-axis and y-axis as indicated in FIG. 1A), while the through-thickness conductivity (i.e., the conductivity in the z-axis, or thickness direction, of the layer) may be reduced as compared to the conductivity in the in-plane direction.

As described elsewhere herein, first layer 10 may be a copper foil layer, and the second layer may include a nickel alloy. In some embodiments, the nickel alloy may include one or more of a nickel vanadium alloy (NiV), a nickel chromium alloy (NiCr), a nickel tin alloy (SnNi), a nickel phosphorous alloy (NiP), a nickel titanium alloy (NiTi) and a nickel niobium alloy (NiNb). In embodiments including a nickel vanadium alloy (NiV), a weight percentage of the nickel may be in a range from about 90% to about 96%, and a weight percentage of the vanadium may be in a range from about 4% to 10%. In embodiments including a nickel chromium alloy (NiCr), a weight percentage of the nickel may be in a range from about 70% to about 90%, and a weight percentage of the chromium may be in a range from about 10% to 30%. In embodiments including a nickel tin alloy (SnNi), a weight percentage of the nickel may be in a range from about 25% to about 45%, and a weight percentage of the tin may be in a range from about 55% to 75%. In embodiments including a nickel phosphorous alloy (NiP), a weight percentage of the nickel may be in a range from about 80% to about 95%, and a weight percentage of the phosphorous may be in a range from about 5% to 20%. In embodiments including a nickel titanium alloy (NiTi), a weight percentage of the nickel may be in a range from about 50% to about 70%, and a weight percentage of the titanium may be in a range from about 30% to 50%.

Figure 2:
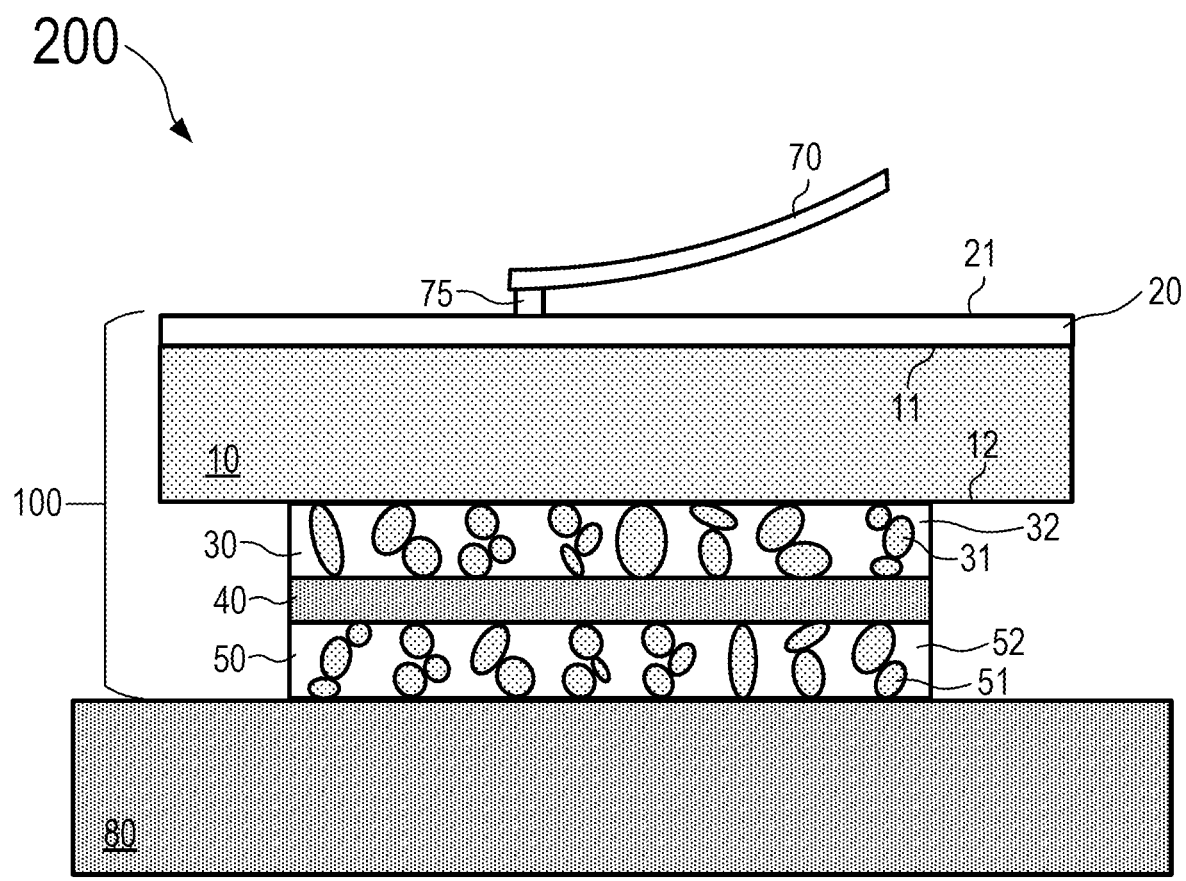
FIG. 2 is a side view of an electronic system featuring an electrically conductive bonding tape, in accordance with an embodiment of the present description.

FIG. 2 is a side view of one embodiment of an electronic system 200 featuring the embodiment of the electrically conductive bonding tape 100 of FIG. 1A. The like-numbered elements of the electrically conductive bonding tape 100 of FIG. 1A shown in FIG. 2 have a similar functional description unless otherwise specified, and the description of these features may not be repeated in the description of FIG. 2.

In some embodiments, an electronic system 200 includes a substrate 80, the electrically conductive bonding tape 100 of FIG. 1 disposed on the substrate 80 with adhesive fifth layer 50 bonding to the substrate, and an electrically conductive resilient component 70 (e.g., a spring clip) resiliently pressed against, and making contact with, the exposed major surface 21 of second layer 20. In some embodiments, the electrically conductive resilient component 70 may include a gold coating or point of contact 75, such that gold coating 75 makes physical contact with the exposed major surface 21 of second layer 20. In some embodiments, substrate 80 may include one or more of stainless steel, aluminum, and titanium.

In some embodiments, the electrically conductive resilient component 70 may be any appropriate conductive contact, including, but not limited to, a conductive foam, a spring clip, a screw, a spring, a pin, a conductive finger, a conductive fabric, and a conductive metal substrate that contacts the exposed major surface 21 of second layer 20 of electrically conductive bonding tape 100.

Figure 3A:
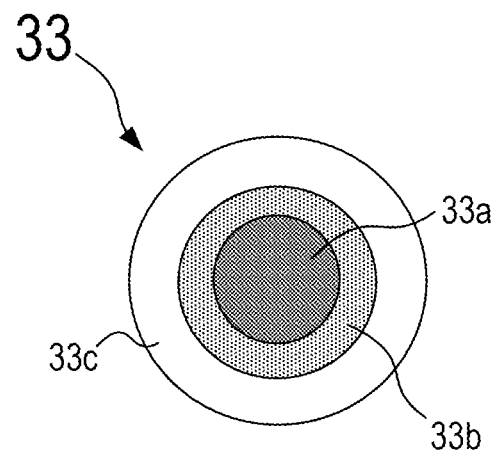
FIGS. 3A and 3B show cross-sectional views of a conductive particle and conductive fiber, respectively, in accordance with an embodiment of the present description.
Figure 3B:
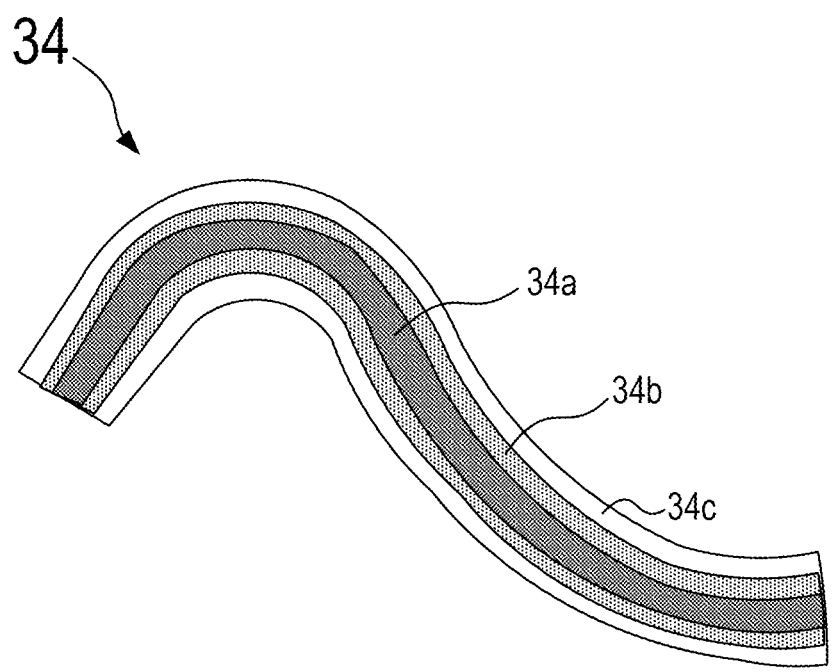

In the previous figures, embodiments of the electrically conductive third layer 30 and electrically conductive adhesive fifth layer 50 were shown including a plurality of electrically conductive elements 31 and 51, respectively. FIGS. 3A and 3B provide cross-sectional views of embodiments of a conductive particle 33 and a conductive fiber 34, respectively.

FIG. 3A shows a conductive particle 33. In some embodiments, conductive particle 33 may include a insulative particle 33a coated with one or more conductive coatings 33b and 33c. Similarly, FIG. 3B shows a conductive fiber 34. In some embodiments, conductive fiber 34 may include an insulative fiber 34a coated with one or more conductive coatings 34b and 34c. As shown in FIGS. 1A and 2, at least some of conductive elements 31, 51 (as conductive particles 33, FIG. 3A, and/or conductive fibers 34, FIG. 3B) may physically contact the second major surface 12 of first layer 10 and fourth layer 40, respectively, creating an electrically conductive path away from the corresponding layer.

Figure 4:
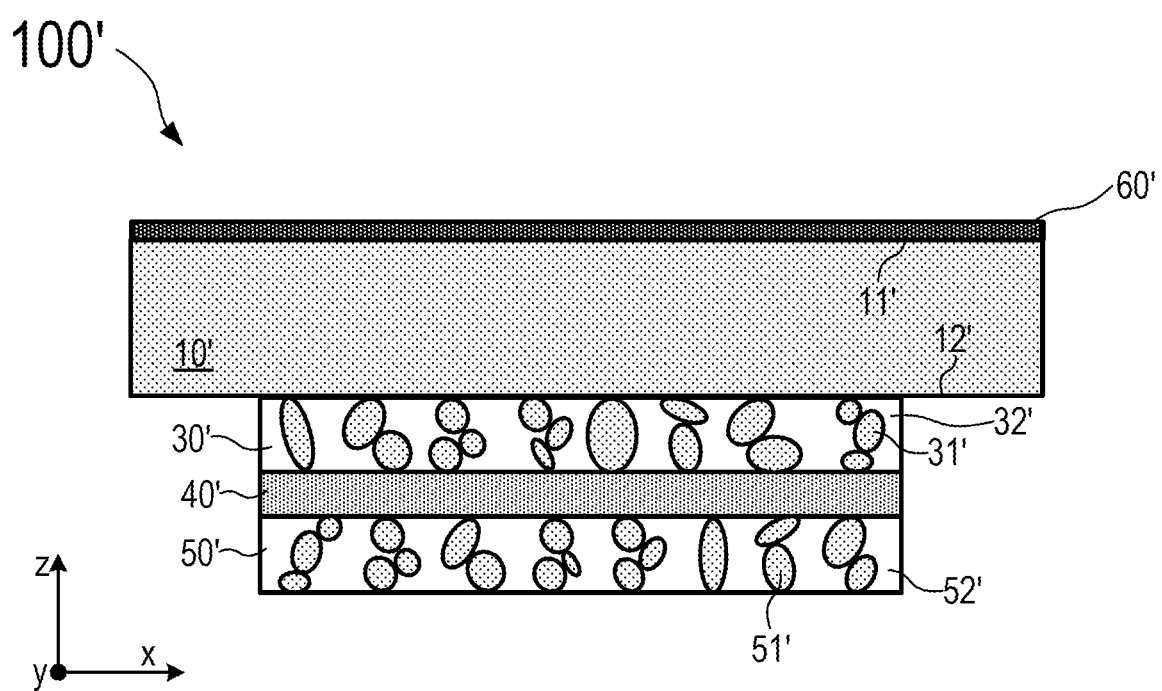
FIG. 4 is a side view of an electrically conductive bonding tape, in accordance with an alternate embodiment of the present description.

In some embodiments, the self-supporting layer of an electrically conductive bonding tape may be nickel-based, rather than based on a copper foil. FIG. 4 is a side view of an alternate embodiment of an electrically conductive bonding tape 100'. In such an embodiment, electrically conductive bonding tape 100' may include an electrically conductive self-supporting nickel first layer 10' and an electrically conductive adhesive second layer 30'.

In some embodiments, the nickel first layer 10' may be at least 80%, or at least 85%, or at least 90%, or at least 95%, or at least 98%, or at least 99%, or at least 99.5% by weight of nickel. In some embodiments, the electrically conductive self-supporting nickel first layer 10' may be electrically conductive in each of three mutually orthogonal directions (e.g., the x-axis, y-axis, and z-axis, as defined in FIG. 4) and may include conductive a first major surface 11' and an opposing second major surface 12'. In some embodiments, the nickel first layer 10' may have an average thickness of greater than about 4 microns, or about 6 microns, or about 8 microns, or about 10 microns, or about 20 microns, or about 50 microns, or about 75 microns, or about 100 microns, or about 125 microns, or about 150 microns, or about 175 microns, or about 200 microns.

In some embodiments, the electrically conductive adhesive second layer 30' may be bonded to the second major surface 12' of the self-supporting first layer 10'. In some embodiments, the adhesive second layer 30' may be electrically conductive in at least one of the three mutually orthogonal directions (e.g., in the z-axis, or alternately in the in-plane direction defined by the x-axis and the y-axis). In some embodiments, the adhesive second layer 30' may include a plurality of electrically conductive elements 31' dispersed in a substantially electrically insulative material 32'. In some embodiments, at least some of the electrically conductive elements 31' may physically contact the second major surface 12' of the self-supporting first layer 10'.

In some embodiments, the electrically conductive bonding tape may further include an electrically conductive third layer 40' sandwiched between, and bonded to, the electrically conductive adhesive second layer 30' and an electrically conductive adhesive fourth layer 50'. In some embodiments, the adhesive fourth layer 50' may be electrically conductive in at least one of the three mutually orthogonal directions (e.g., in the z-axis, or alternately in the in-plane direction defined by the x-axis and the y-axis). In some embodiments, the adhesive fourth layer 50' may include a plurality of electrically conductive elements 51' dispersed in a substantially electrically insulative material 52'. In some embodiments, at least some of the electrically conductive elements 51' of the fourth layer 50' may physically contact the third layer 40'.

In some embodiments, the conductive elements 31' in the adhesive second layer 30' and/or the conductive elements 51' in the adhesive fourth layer 50' may include one or more of conductive particles and conductive fibers. In some embodiments, the conductive particles may include insulative particles coated with one or more conductive coatings. In some embodiments, the conductive fibers may include insulative fibers coated with one or more conductive coatings. Refer to FIGS. 3A and 3B for additional detail on conductive particles 33 and conductive fibers 34.

In some embodiments, the electrically conductive bonding tape may further include an electrically conductive fifth layer 60' coated on the first major surface 11' (opposite the second major surface 12') of the first layer 10'. In such embodiments, the fifth layer 60' may include at least 20%, or at least 30%, or at least 40%, or at least 50%, or at least 60%, or at least 70%, or at least 80% by weight of nickel. In some embodiments, the fifth layer 60' may have an average thickness of greater than about 0.03 microns, or about 0.04 microns, or about 0.05 microns, or about 0.1 microns, or about 0.25 microns, or about 0.5 microns, or about 1 micron, or about 2 microns, or about 3 microns, or about 4 microns, or about 5 microns.

In some embodiments, the electrically conductive fifth layer 60' may include a nickel alloy including one or more of a nickel vanadium alloy (NiV), a nickel chromium alloy (NiCr), a nickel tin alloy (SnNi), a nickel phosphorous alloy (NiP), a nickel titanium alloy (NiTi) and a nickel niobium alloy (NiNb). In embodiments including a nickel vanadium alloy (NiV), a weight percentage of the nickel may be in a range from about 90% to about 96%, and a weight percentage of the vanadium may be in a range from about 4% to 10%. In embodiments including a nickel chromium alloy (NiCr), a weight percentage of the nickel may be in a range from about 70% to about 90%, and a weight percentage of the chromium may be in a range from about 10% to 30%. In embodiments including a nickel tin alloy (SnNi), a weight percentage of the nickel may be in a range from about 25% to about 45%, and a weight percentage of the tin may be in a range from about 55% to 75%. In embodiments including a nickel phosphorous alloy (NiP), a weight percentage of the nickel may be in a range from about 80% to about 95%, and a weight percentage of the phosphorous may be in a range from about 5% to 20%. In embodiments including a nickel titanium alloy (NiTi), a weight percentage of the nickel may be in a range from about 50% to about 70%, and a weight percentage of the titanium may be in a range from about 30% to 50%.

EXAMPLES

Preparation and testing of three reference substrates (Reference A-1, Reference A-2, and Reference B, described below) and four example substrates constructed using the methods described herein (Example A, Example B, Example C-1, and Example C-2) was completed. Results and test methods are described below.

References A-1 and A-2: Direct Metal Pin Ground on a High-PIM Substrates

The DC resistance, harmonics, and passive intermodulation (PIM) interference for two different substrate types (stainless steel and aluminum) with a direct metal pin ground (no coating) were measured and are presented in Table 1. For DC resistance, harmonics, and PIM measurements, lower numbers (more negative for PIM and harmonics) indicate improved performance over higher numbers. The DC resistance, PIM, and harmonics were measured using industry standard DC resistance meters, signal generators, spectrum analyzers, and duplexers as needed to configure for the specific DC resistance, PIM, or harmonics testing of the test printed circuit boards and samples under test.

TABLE 1

Results for Reference A

Test Method: Metal pin grounding.
Bonding Size: Not applicable.
Bonding Condition: Gap spacing.
Signal Generator: −13.45 dBm 869-894
Amplifier: 33.7 dBm 33.7 dBm
Span: 100 Hz
RBW (Resolution Bandwidth): 10 Hz
VBW (Video Bandwidth): 50 Hz
SWP (Sweep Time): 5 Seconds

| Part Name | Substrate Reference | No. | Resistance DC Resistance (ohms) | Harmonics [dBm] 1600 MHz (Hx) | 2400 MHz (Hx) Initial PIM/Hx | PIM [dBc] 842 MHz (PIM) |
|---|---|---|---|---|---|---|
| | | Ref | | −101.6 | −99.4 | −126.3 |
| Reference A-1 | Stainless Steel Type 316L | 1 | 6.570 | −73.8 | −64.9 | −85.7 |
| | | 2 | 1.717 | −67.5 | −64.3 | −103.1 |
| | | 3 | 2.052 | −92.7 | −78.0 | −95.4 |
| | | 4 | 2.396 | −86.2 | −87.4 | −88.6 |
| | | 5 | 2.452 | −51.0 | −44.7 | −102.8 |
| | | 6 | 2.710 | −63.6 | −63.6 | −90.2 |
| Reference A-2 | Aluminum Type 5052 | 1 | 1.155 | −97.5 | −87.1 | −97.6 |
| | | 2 | 0.473 | −90.8 | −90.6 | −101.2 |
| | | 3 | 0.535 | −85.9 | −49.5 | −93.5 |
| | | 4 | 1.422 | −75.9 | −45.1 | −107.8 |
| | | 5 | 1.175 | −77.1 | −62.2 | −108.8 |
| | | 6 | 2.505 | −65.4 | −68.0 | −104.7 |

Reference B: Metal Pin Ground on Sputtered Gold (Au)

The DC resistance, harmonics, and passive intermodulation (PIM) interference for metal pin ground on a stainless steel substrate with a sputtered gold coating were measured and are presented in Table 2. For DC resistance, harmonics, and PIM measurements, lower numbers (more negative for PIM and harmonics) indicate improved performance over higher numbers. The DC resistance, PIM, and harmonics were measured using industry standard DC resistance meters, signal generators, spectrum analyzers, and duplexers as needed to configure for the specific DC resistance, PIM, or harmonics testing of the test printed circuit boards and samples under test.

TABLE 2

Results for Reference B

Test Method: Metal pin grounding.
Bonding Size: 10 mm by 3 mm.
Bonding Condition: Gap spacing.
Signal Generator: −13.45 dBm    869-894
Amplifier:    33.7 dBm    33.7 dBm
Span: 100 Hz
RBW (Resolution Bandwidth): 10 Hz
VBW (Video Bandwidth): 50 Hz
SWP (Sweep Time): 5 Seconds

| Part Name | Substrate Reference | No. | Resistance DC Resistance (ohms) | Harmonics [dBm] 1600 MHz (Hx) | 2400 MHz (Hx) Initial PIM/Hx | 842 MHz (PIM) |
|---|---|---|---|---|---|---|
| | | Ref | | −101.6 | −99.4 | −126.3 |
| Reference B | Stainless Steel Type 316L | 1 | 0.204 | −97.2 | −90.9 | −105.1 |
| | | 2 | 0.264 | −96.7 | −91.5 | −105.5 |
| | | 3 | 0.188 | −92.7 | −91.0 | −104.3 |
| | | 4 | 0.239 | −96.1 | −90.9 | −104.1 |
| | | 5 | 0.216 | −96.3 | −91.5 | −103.5 |
| | | 6 | 0.190 | −93.2 | −91.2 | −104.2 |

Example A: Metal Pin Ground on Low PIM Ground Tape

The DC resistance, harmonics, and passive intermodulation (PIM) interference for metal pin ground on an aluminum substrate covered with a low PIM ground tape prepared as described below were measured and are presented in Table 3. For DC resistance, harmonics, and PIM measurements, lower numbers (more negative for PIM and harmonics) indicate improved performance over higher numbers. The DC resistance, PIM, and harmonics were measured using industry standard DC resistance meters, signal generators, spectrum analyzers, and duplexers as needed to configure for the specific DC resistance, PIM, or harmonics testing of the test printed circuit boards and samples under test.

Test Method: Metal pin grounding.
Bonding Size: 10 mm by 3 mm.
Bonding Condition: Gap spacing.

| | | | |
|---|---|---|---|
| Signal Generator: | −13.45 dBm | 869-894 | |
| Amplifier: | 33.7 dBm | 33.7 dBm | |
| Span: | 100 Hz | | |
| RBW (Resolution Bandwidth): | 10 Hz | | |
| VBW (Video Bandwidth): | 50 Hz | | |
| SWP (Sweep Time): | 5 Seconds | | |

Preparation of CPSA: The Conductive Pressure Sensitive Adhesive (CPSA) can be made by any desired means that allows the CPSA to achieve a conductive path between desired substrates. Common methods of making CPSA's is the blending of conductive fillers (nickel, silver, metal coated particles, fibers, etc.) in a resin matrix and solvent coating them unto a release liner and drying and/or curing. Alternative methods include hot-melt coating, 100% solids coating, and curing (UV or thermal initiated cure initiated), etc.

For example, noted, a solution of conductive, pressure sensitive adhesive (PSA) was prepared as follows. 1 kg of an acrylic copolymer solution, 40% solids, (available under the trade designation TA-H3300 from Truss LTD., Gyeongsangbuk-do), 10 g of an epoxy crosslinker solution, 10% solids, (available under the trade designation THAR-020 from Truss LTD., Gyeongsangbuk-do, Korea), 15 g of 30 um nickel particles (available under the trade designation SML-30 from SNC TECH Co. Kyounggi-do, Korea), and 350 g ethyl acetate were mixed together using conventional high shear mixing, forming an adhesive precursor solution. The adhesive precursor solution was then coated on the low release force side of a double coated silicone polyester liner by a conventional notch bar coating method and dried by passing through a tunnel drying oven. The coated adhesive material with conductive particles was then laminated to one side of a 15-micron thick, conductive polyester nonwoven substrate (available under the trade designation PNW-5-PCN™ from Ajin Electron, Busan, Korea), by passing between a pair of laminating rolls, followed by winding the conductive, nonwoven adhesive into a roll.

Preparation of metal foil backing and final product—The metal layer may be applied to the metal substrate in various conventional methods based on metal type applied (methods might include sputtering, plating, evaporation, chemical vapor deposition, E-Beam, etc.). For example, noted, the NiCr (80:20) was sputtered to a 10 nm thickness onto a 12-um nickel plated Cu foil.

The final product Example A was prepared by laminating the foil backing on to the CPSA.

TABLE 3

Results for Example A

| Part Name | Substrate Reference | No. | Resistance DC Resistance (ohms) | Harmonics [dBm] 1600 MHz (Hx) | 2400 MHz (Hx) Initial PIM/Hx | PIM [dBc] 842 MHz (PIM) |
| --- | --- | --- | --- | --- | --- | --- |
| | | | 0.808 | −104.1 | −96.2 | −126.1 |
| Example A | Aluminum | 1 | 0.484 | −93.4 | −95.2 | −111.1 |
| | Type 5052 | 2 | 0.366 | −89.6 | −96.3 | −111.4 |
| | | 3 | 0.361 | −92.6 | −96.8 | −111.5 |
| | | 4 | 0.458 | −94.1 | −95.3 | −110.8 |
| | | 5 | 0.469 | −92.3 | −95.2 | −108.5 |
| | | 6 | 0.458 | −94.8 | −94.4 | −110.9 |

Example B: Metal Pin Ground on Low PIM Ground Tape

The DC resistance, harmonics, and passive intermodulation (PIM) interference for metal pin ground on an aluminum substrate covered with a low PIM ground tape prepared as described below were measured and are presented in Table 4. For DC resistance, harmonics, and PIM measurements, lower numbers (more negative for PIM and harmonics) indicate improved performance over higher numbers. The DC resistance, PIM, and harmonics were measured using industry standard DC resistance meters, signal generators, spectrum analyzers, and duplexers as needed to configure for the specific DC resistance, PIM, or harmonics testing of the test printed circuit boards and samples under test.

| Test Method: Metal pin grounding. Bonding Size: 10 mm by 3 mm. Bonding Condition: Gap spacing. | | |
| --- | --- | --- |
| Signal Generator: | −13.45 dBm | 869-894 |
| Amplifier: | 33.7 dBm | 33.7 dBm |
| Span: | 100 Hz | |
| RBW (Resolution Bandwidth): | 10 Hz | |
| VBW (Video Bandwidth): | 50 Hz | |
| SWP (Sweep Time): | 5 Seconds | |

Preparation of CPSA: The Conductive Pressure Sensitive Adhesive (CPSA) can be made by any desired means that allows the CPSA to achieve a conductive path between desired substrates. Common methods of making CPSA's is the blending of conductive fillers (nickel, silver, metal coated particles, fibers, etc.) in a resin matrix and solvent coating them unto a release liner and drying and/or curing. Alternative methods include hot-melt coating, 100% solids coating, and curing (UV or thermal initiated cure initiated), etc.

For example, noted, a solution of conductive, pressure sensitive adhesive (PSA) was prepared as follows. 1 kg of an acrylic copolymer solution, 40% solids, (available under the trade designation TA-H3300 from Truss LTD., Gyeongsangbuk-do), 10 g of an epoxy crosslinker solution, 10% solids, (available under the trade designation THAR-020 from Truss LTD., Gyeongsangbuk-do, Korea), 15 g of 30 um nickel particles (available under the trade designation SML-30 from SNC TECH Co. Kyounggi-do, Korea), and 350 g ethyl acetate were mixed together using conventional high shear mixing, forming an adhesive precursor solution. The adhesive precursor solution was then coated on the low release force side of a double coated silicone polyester liner by a conventional notch bar coating method and dried by passing through a tunnel drying oven. The coated adhesive material with conductive particles was then laminated to one side of a 15-micron thick, conductive polyester nonwoven substrate (available under the trade designation PNW-5-PCN™ from Ajin Electron, Busan, Korea), by passing between a pair of laminating rolls, followed by winding the conductive, nonwoven adhesive into a roll.

Preparation of metal foil backing and final product—The example foil backing is based on a 10-um annealed pure nickel foil (>99.5% Nickel) and was prepared for this example. The foil is designated as NIFLA-10, available from Fukuda Metal Foil & Powder Co. LTD 20 Nakatomi-cho, Nishinoyama, Yamashina-ku, Kyoto 607-8305, Japan).

The final product Example B was prepared by laminating the nickel foil backing on to the CPSA.

TABLE 4

Results for Example B

| Part Name | Substrate Reference | No. | Resistance DC Resistance (ohms) | Harmonics [dBm] 1600 MHz (Hx) | 2400 MHz (Hx) Initial PIM/Hx | PIM [dBc] 842 MHz (PIM) |
| --- | --- | --- | --- | --- | --- | --- |
| | | | Ref | −106.9 | −96.3 | −125.7 |
| Example B | Aluminum | 1 | 0.382 | −98.1 | −93.0 | −110.2 |
| | Type 5052 | 2 | 0.300 | −97.1 | −92.0 | −108.9 |
| | | 3 | 0.285 | −95.2 | −93.0 | −110.1 |
| | | 4 | 0.398 | −98.3 | −92.3 | −111.3 |
| | | 5 | 0.239 | −95.6 | −93.5 | −109.7 |
| | | 6 | 0.270 | −97.1 | −92.5 | −109.5 |

Examples C-1 and C-2: Metal Pin Ground on Low PIM Ground Tape

The DC resistance, harmonics, and passive intermodulation (PIM) interference for metal pin ground on a low PIM ground tape for two different substrate types (stainless steel and aluminum) prepared as described below were measured and are presented in Table 5. For DC resistance, harmonics, and PIM measurements, lower numbers (more negative for PIM and harmonics) indicate improved performance over higher numbers. The DC resistance, PIM, and harmonics were measured using industry standard DC resistance meters, signal generators, spectrum analyzers, and duplexers as needed to configure for the specific DC resistance, PIM, or harmonics testing of the test printed circuit boards and samples under test.

ethyl acetate were mixed together using conventional high shear mixing, forming an adhesive precursor solution. The adhesive precursor solution was then coated on the low release force side of a double coated silicone polyester liner by a conventional notch bar coating method and dried by passing through a tunnel drying oven.

Preparation of metal foil backing and final product—The example foil backing is based on a 5-um pure nickel foil (>99.5% Nickel) and was prepared for this example. The foil is designated as NIFL-5, available from Fukuda Metal Foil & Powder Co. LTD 20 Nakatomi-cho, Nishinoyama, Yamashina-ku, Kyoto 607-8305, Japan.

The final product Example C1 and C2 were prepared by laminating the nickel foil backing on to the CPSA.

TABLE 5

Results for Examples C-1 and C-2

| Part Name | Substrate Reference | No. | Resistance DC Resistance (ohms) | Harmonics [dBm] 1600 MHz (Hx) | 2400 MHz (Hx) Initial PIM/Hx | PIM [dBc] 842 MHz (PIM) |
|---|---|---|---|---|---|---|
| | | Ref | | −101.3 | −99.9 | −125.9 |
| Example C-1 | Stainless Steel Type 316L | 1 | 0.369 | −93.8 | −91.2 | −108.3 |
| | | 2 | 0.481 | −88.3 | −90.0 | −113.6 |
| | | 3 | 0.485 | −93.5 | −91.3 | −107.3 |
| | | 4 | 0.433 | −94.1 | −90.8 | −107.3 |
| | | 5 | 0.354 | −90.6 | −92.0 | −108.9 |
| | | 6 | 0.294 | −96.7 | −92.3 | −107.8 |
| Example C-2 | Aluminum Type 5052 | 1 | 0.234 | −94.8 | −93.0 | −109.7 |
| | | 2 | 0.218 | −96.8 | −93.2 | −109.9 |
| | | 3 | 0.231 | −99.3 | −92.3 | −109.7 |
| | | 4 | 0.222 | −96.2 | −92.5 | −109.7 |
| | | 5 | 0.181 | −99.4 | −92.9 | −109.7 |
| | | 6 | 0.208 | −97.6 | −93.4 | −109.8 |

| Test Method: Metal pin grounding. Bonding Size: 10 mm by 3 mm. Bonding Condition: Gap spacing. | | |
|---|---|---|
| Signal Generator: | −13.45 dBm | 869-894 |
| Amplifier: | 33.7 dBm | 33.7 dBm |
| Span: | 100 Hz | |
| RBW (Resolution Bandwidth): | 10 Hz | |
| VBW (Video Bandwidth): | 50 Hz | |
| SWP (Sweep Time): | 5 Seconds | |

Preparation of CPSA: The Conductive Pressure Sensitive Adhesive (CPSA) can be made by any desired means that allows the CPSA to achieve a conductive path between desired substrates. Common methods of making CPSA's is the blending of conductive fillers (nickel, silver, metal coated particles, fibers, etc.) in a resin matrix and solvent coating them unto a release liner and drying and/or curing. Alternative methods include hot-melt coating, 100% solids coating, and curing (UV or thermal initiated cure initiated), etc.

For example, noted, a solution of conductive, pressure sensitive adhesive (PSA) was prepared as follows. 1 kg of an acrylic copolymer solution, 40% solids, (available under the trade designation TA-H3300 from Truss LTD., Gyeongsangbuk-do), 10 g of an epoxy crosslinker solution, 10% solids, (available under the trade designation THAR-020 from Truss LTD., Gyeongsangbuk-do, Korea), 15 g of 10 um nickel particles (available under the trade designation PNS-10R from Duksan Hi-Metal Co. Ulsan, Korea), and 350 g It can be seen, based on the Examples above, that the tape design embodiments described herein allow for improved DC resistance, harmonics, and passive intermodulation (PIM) over the pin to stainless steel or pin to aluminum grounding test designs. The novel tape design embodiments described herein also show improvement over a gold layer applied to a stainless steel surface for PIM and harmonics, while achieving a sufficiently low DC resistance.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

Terms such as "substantially" will be understood in the context in which they are used and described in the present description by one of ordinary skill in the art. If the use of "substantially equal" is not otherwise clear to one of ordinary skill in the art in the context in which it is used and described in the present description, "substantially equal" will mean about equal where about is as described above. If the use of "substantially parallel" is not otherwise clear to one of ordinary skill in the art in the context in which it is used and described in the present description, "substantially parallel" will mean within 30 degrees of parallel. Directions or surfaces described as substantially parallel to one another may, in some embodiments, be within 20 degrees, or within 10 degrees of parallel, or may be parallel or nominally parallel. If the use of "substantially aligned" is not otherwise clear to one of ordinary skill in the art in the context in which it is used and described in the present description, "substantially aligned" will mean aligned to within 20% of a width of the objects being aligned. Objects described as substantially aligned may, in some embodiments, be aligned to within 10% or to within 5% of a width of the objects being aligned.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed:

1. An electrically conductive bonding tape electrically conductive in at least a thickness direction of the electrically conductive bonding tape and comprising:
   an electrically conductive self-supporting nickel first layer comprising at least 80% by weight of nickel and electrically conductive in each of three mutually orthogonal directions, the nickel first layer comprising electrically conductive opposing first and second major surfaces and having an average thickness of greater than about 4 microns; and
   an electrically conductive adhesive second layer bonded to the second major surface of the self-supporting first layer, the adhesive second layer more electrically conductive in an in-plane direction than in a thickness direction of the adhesive second layer.

2. The electrically conductive bonding tape of claim 1, wherein the adhesive second layer comprises a plurality of electrically conductive elements dispersed in a substantially electrically insulative material, at least some of the electrically conductive elements physically contacting the second major surface of the self-supporting first layer.

3. The electrically conductive bonding tape of claim 2, further comprising an electrically conductive third layer sandwiched between, and bonded to, the electrically conductive adhesive second layer and an electrically conductive adhesive fourth layer, the adhesive fourth layer electrically conductive in at least one of the three mutually orthogonal directions and comprising a plurality of second electrically conductive elements dispersed in a substantially electrically insulative material, at least some of the electrically conductive elements of the fourth layer physically contacting the third layer.

4. The electrically conductive bonding tape of claim 1 further comprising an electrically conductive fifth layer coated on the first, opposite the second, major surface of the first layer and comprising at least 20% by weight of nickel, the fifth layer having an average thickness of greater than about 0.03 microns.

5. The electrically conductive bonding tape of claim 4, wherein the electrically conductive fifth layer comprises a nickel alloy comprising one or more of a nickel vanadium alloy (NiV), a nickel chromium alloy (NiCr), a nickel tin alloy (SnNi), a nickel phosphorous alloy (NiP), a nickel titanium alloy (NiTi) and a nickel niobium alloy (NiNb).

* * * * *